(12) United States Patent
Wu et al.

(10) Patent No.: US 11,121,447 B2
(45) Date of Patent: Sep. 14, 2021

(54) DIELECTRIC COVERS FOR ANTENNAS

(71) Applicant: Apple Inc., Cupertino, CA (US)

(72) Inventors: Jiangfeng Wu, San Jose, CA (US); Siwen Yong, San Francisco, CA (US); Yi Jiang, Cupertino, CA (US); Lijun Zhang, San Jose, CA (US); Mattia Pascolini, San Francisco, CA (US)

(73) Assignee: Apple Inc., Cupertino, CA (US)

(*) Notice: Subject to any disclaimer, the term of this patent is extended or adjusted under 35 U.S.C. 154(b) by 592 days.

(21) Appl. No.: 15/717,701

(22) Filed: Sep. 27, 2017

(65) Prior Publication Data

US 2019/0097301 A1 Mar. 28, 2019

(51) Int. Cl.

| | |
|---|---|
| *H01Q 1/12* | (2006.01) |
| *H01Q 3/34* | (2006.01) |
| *H05K 9/00* | (2006.01) |
| *H05K 5/03* | (2006.01) |
| *H01Q 1/42* | (2006.01) |
| *H01Q 19/06* | (2006.01) |
| *H01Q 3/28* | (2006.01) |
| *H01Q 21/06* | (2006.01) |
| *H01Q 3/38* | (2006.01) |

(52) U.S. Cl.
CPC ............. *H01Q 1/12* (2013.01); *H01Q 1/421* (2013.01); *H01Q 3/34* (2013.01); *H01Q 19/062* (2013.01); *H05K 5/03* (2013.01); *H05K 9/00* (2013.01); *H01Q 3/28* (2013.01); *H01Q 3/38* (2013.01); *H01Q 21/065* (2013.01)

(58) Field of Classification Search
CPC ............ H01Q 1/421; H01Q 3/34; H01Q 1/12; H01Q 19/062; H01Q 3/38; H01Q 21/065; H01Q 3/28; H05K 5/03; H05K 9/00
See application file for complete search history.

(56) References Cited

U.S. PATENT DOCUMENTS 5,167,386 A * 12/1992 Laquer ................... B64G 1/645
102/378
5,216,435 A * 6/1993 Hirata ....................... H01Q 1/28
333/1

(Continued)

OTHER PUBLICATIONS

Jiang et al., U.S. Appl. No. 15/584,889, filed May 2, 2017.

*Primary Examiner* — Graham P Smith
*Assistant Examiner* — Jae K Kim
(74) *Attorney, Agent, or Firm* — Treyz Law Group, P.C.; Tianyi He

(57) ABSTRACT

An electronic device may be provided with wireless communications circuitry and control circuitry. The wireless communications circuitry may include centimeter and millimeter wave transceiver circuitry and a phased antenna array. A dielectric cover may be formed over the phased antenna array. The phased antenna array may transmit and receive wireless radio-frequency signals through the dielectric cover. The dielectric cover may have first and second opposing surfaces. The second surface may face the phased antenna array and may have a curvature. The curvature of the second surface may include one or more recessed regions of the dielectric cover. The one or more recessed regions of the second surface may serve to maximize and broaden the coverage area for the phased antenna array. The first surface may be conformal to other structures in the electronic device.

19 Claims, 12 Drawing Sheets

(56) References Cited

U.S. PATENT DOCUMENTS

| | | | |
|---|---|---|---|
| 8,514,139 B2* | 8/2013 | Adams | H01Q 13/18 |
| | | | 343/770 |
| 9,570,420 B2 | 2/2017 | Castaneda et al. | |
| 2003/0052829 A1* | 3/2003 | Desargant | H01Q 1/28 |
| | | | 343/705 |
| 2005/0159187 A1* | 7/2005 | Mendolia | G06K 7/10079 |
| | | | 455/562.1 |
| 2006/0202909 A1* | 9/2006 | Nagai | H01Q 15/08 |
| | | | 343/911 R |
| 2010/0103072 A1* | 4/2010 | Wu | H01Q 1/002 |
| | | | 343/872 |
| 2011/0063183 A1* | 3/2011 | Sanford | H01Q 1/42 |
| | | | 343/848 |
| 2016/0359546 A1 | 12/2016 | Bennett et al. | |
| 2017/0054205 A1* | 2/2017 | Feldman | H01Q 21/26 |
| 2017/0117754 A1 | 4/2017 | Noori et al. | |
| 2017/0346176 A1* | 11/2017 | Linn | H01Q 21/064 |
| 2018/0090851 A1* | 3/2018 | Feldman | H01Q 21/065 |
| 2018/0159207 A1* | 6/2018 | Shurish | H01Q 1/422 |
| 2019/0089052 A1* | 3/2019 | Yong | H01Q 1/2283 |
| 2020/0262958 A1* | 8/2020 | Takahashi | C08L 23/00 |
| 2020/0373658 A1* | 11/2020 | Iluz | H01Q 15/0026 |

\* cited by examiner

DIELECTRIC COVERS FOR ANTENNAS

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications.

It may be desirable to support wireless communications in millimeter wave and centimeter wave communications bands. Millimeter wave communications, which are sometimes referred to as extremely high frequency (EHF) communications, and centimeter wave communications involve communications at frequencies of about 10-300 GHz. Operation at these frequencies may support high bandwidths, but may raise significant challenges. For example, millimeter wave communications signals generated by antennas can be characterized by substantial attenuation and/or distortion during signal propagation through various mediums.

In addition, antennas are often provided with a protective dielectric cover to protect the antennas from external contaminants or damage. However, if care is not taken, the dielectric cover may undesirably distort or weaken the radiation characteristics of the antenna.

It would therefore be desirable to be able to provide electronic devices with improved wireless communications circuitry such as communications circuitry that supports millimeter wave communications.

SUMMARY

An electronic device may be provided with wireless circuitry. The wireless circuitry may include one or more antennas and transceiver circuitry such as centimeter and millimeter wave transceiver circuitry (e.g., circuitry that transmits and receives antennas signals at frequencies greater than 10 GHz). The antenna elements may be arranged in a phased antenna array. A dielectric cover (sometimes referred to herein as a radome) may be formed over the antenna elements in the phased antenna array. The phased antenna array may transmit and receive a beam of signals through the dielectric cover and may steer the signals over a corresponding field of view.

The dielectric cover may have a first surface and a second opposing surface that faces the phased antenna array. The second surface may be a curved surface (e.g., may include a curve). The curved surface may include one or more curved cavities (e.g., one or more recessed regions at the second surface having separate radii of curvature). The one or more cavities may be formed directly over the one or more antenna elements arranged in phased antenna array. The antenna elements may convey wireless signals through the corresponding cavities in the dielectric cover.

The first surface of the dielectric cover may be a planar surface or a curved surface. The electronic device may include an adjacent structure (e.g., an internal structure, a housing structure, etc.). The dielectric cover may be conformal to the adjacent structure. In particular, the first surface of the dielectric cover may be conformal to the structure. The second surface of the dielectric cover may be conformal to the first surface of the dielectric cover. Additionally, the antenna array may be formed on a bent substrate, and the dielectric cover may be conformal to the bent substrate on which the antenna array is formed. In this way, the dielectric cover may have a curved surface that minimizes interfacial signal reflections at the curved surface to maximize the gain of the antenna array over which the dielectric cover is formed, while adapting to structures adjacent to the dielectric cover.

DETAILED DESCRIPTION

Electronic devices may contain wireless circuitry. The wireless circuitry may include one or more antennas. The antennas may include phased antenna arrays that are used for handling millimeter wave and centimeter wave communications. Millimeter wave communications, which are sometimes referred to as extremely high frequency (EHF) communications, involve signals at 60 GHz or other frequencies between about 30 GHz and 300 GHz. Centimeter wave communications involve signals at frequencies between about 10 GHz and 30 GHz. While uses of millimeter wave communications may be described herein as examples, centimeter wave communications, EHF communications, or any other types of communications may be similarly used. If desired, electronic devices may also contain wireless communications circuitry for handling satellite navigation system signals, cellular telephone signals, local wireless area network signals, near-field communications, light-based wireless communications, or other wireless communications.

Electronic devices (such as device 10 in FIG. 1) may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a virtual or augmented reality headset device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless access point or base station (e.g., a wireless router or other equipment for routing communications between other wireless devices and a larger network such as the internet or a cellular telephone network), a desktop computer, a keyboard, a gaming controller, a computer mouse, a mousepad, a trackpad or touchpad, equipment that implements the functionality of two or more of these devices, or other electronic equipment. The above-mentioned examples are merely illustrative. Other configurations may be used for electronic devices if desired.

Figure 1:
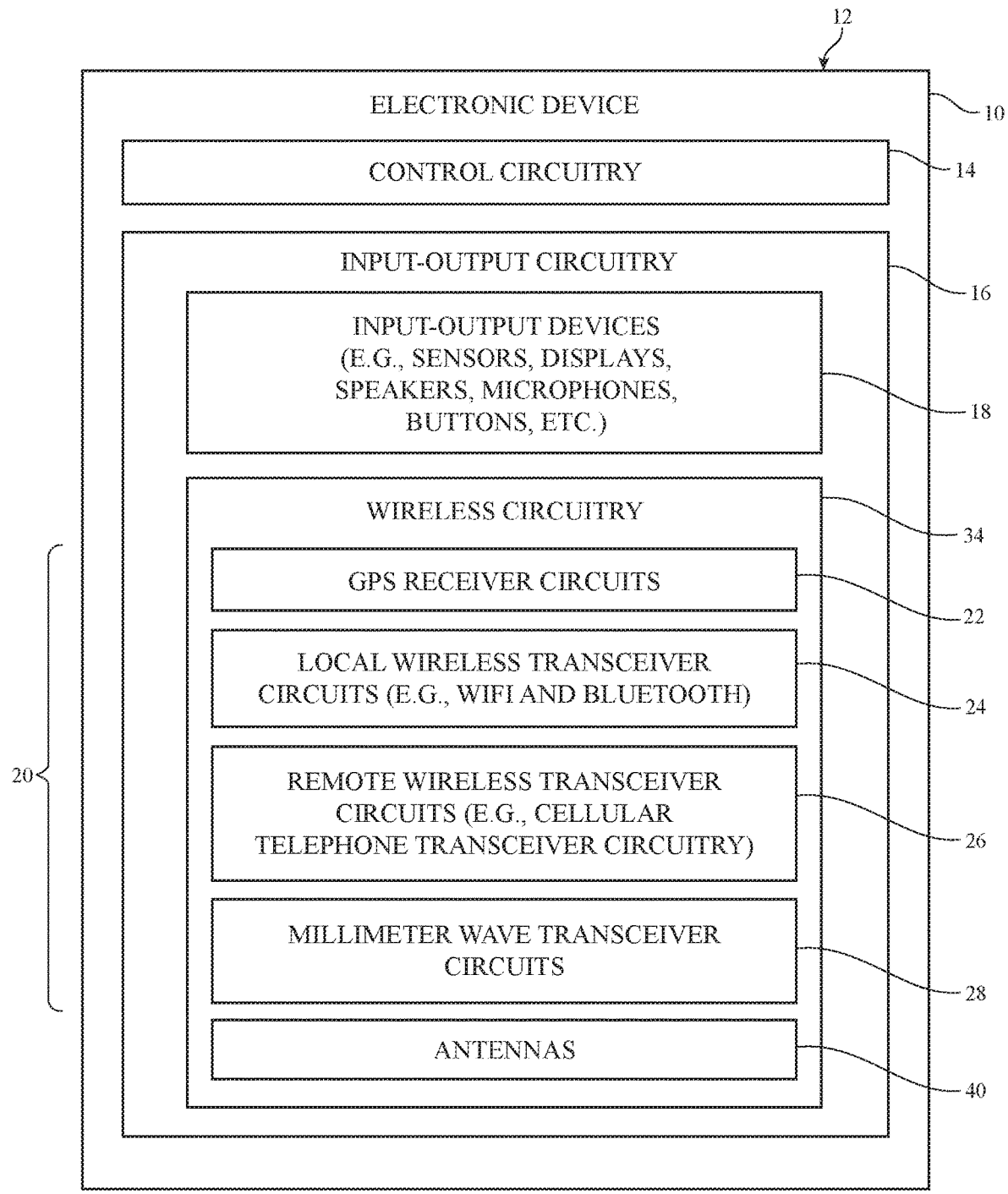
FIG. 1 is a schematic diagram of an illustrative electronic device with wireless communications circuitry in accordance with an embodiment.

A schematic diagram showing illustrative components that may be used in an electronic device such as electronic device 10 is shown in FIG. 1. As shown in FIG. 1, device 10 may include storage and processing circuitry such as control circuitry 14. Control circuitry 14 may include storage such as hard disk drive storage, nonvolatile memory (e.g., flash memory or other electrically-programmable-read-only memory configured to form a solid-state drive), volatile memory (e.g., static or dynamic random-access-memory), etc. Processing circuitry in control circuitry 14 may be used to control the operation of device 10. This processing circuitry may be based on one or more microprocessors, microcontrollers, digital signal processors, baseband processor integrated circuits, application specific integrated circuits, etc.

Control circuitry 14 may be used to run software on device 10, such as internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network protocols (e.g., IEEE 802.11 protocols—sometimes referred to as WiFi®), protocols for other short-range wireless communications links such as the Bluetooth® protocol or other WPAN protocols, IEEE 802.1 lad protocols, cellular telephone protocols, MIMO protocols, antenna diversity protocols, satellite navigation system protocols, etc.

Device 10 may include input-output circuitry 16. Input-output circuitry 16 may include input-output devices 18. Input-output devices 18 may be used to allow data to be supplied to device 10 and to allow data to be provided from device 10 to external devices. Input-output devices 18 may include user interface devices, data port devices, and other input-output components. For example, input-output devices may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, accelerometers or other components that can detect motion and device orientation relative to the Earth, capacitance sensors, proximity sensors (e.g., a capacitive proximity sensor and/or an infrared proximity sensor), magnetic sensors, and other sensors and input-output components.

Input-output circuitry 16 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas 40, transmission lines, and other circuitry for handling RF wireless signals. Wireless signals can also be sent using light (e.g., using infrared communications).

Wireless communications circuitry 34 may include transceiver circuitry 20 for handling various radio-frequency communications bands. For example, circuitry 34 may include transceiver circuitry 22, 24, 26, and 28.

Transceiver circuitry 24 may be wireless local area network transceiver circuitry. Transceiver circuitry 24 may handle 2.4 GHz and 5 GHz bands for WiFi® (IEEE 802.11) communications and may handle the 2.4 GHz Bluetooth® communications band.

Circuitry 34 may use cellular telephone transceiver circuitry 26 for handling wireless communications in frequency ranges such as a low communications band from 700 to 960 MHz, a midband from 1710 to 2170 MHz, and a high band from 2300 to 2700 MHz or other communications bands between 700 MHz and 2700 MHz or other suitable frequencies (as examples). Circuitry 26 may handle voice data and non-voice data.

Millimeter wave transceiver circuitry 28 (sometimes referred to as extremely high frequency (EHF) transceiver circuitry 28 or transceiver circuitry 28) may support communications at frequencies between about 10 GHz and 300 GHz. For example, transceiver circuitry 28 may support communications in Extremely High Frequency (EHF) or millimeter wave communications bands between about 30 GHz and 300 GHz and/or in centimeter wave communications bands between about 10 GHz and 30 GHz (sometimes referred to as Super High Frequency (SHF) bands). As examples, transceiver circuitry 28 may support communications in an IEEE K communications band between about 18 GHz and 27 GHz, a $K_a$ communications band between about 26.5 GHz and 40 GHz, a Ku communications band between about 12 GHz and 18 GHz, a V communications band between about 40 GHz and 75 GHz, a W communications band between about 75 GHz and 110 GHz, or any other desired frequency band between approximately 10 GHz and 300 GHz. If desired, circuitry 28 may support IEEE 802.1 lad communications at 60 GHz and/or 5th generation mobile networks or 5th generation wireless systems (5G) communications bands between 27 GHz and 90 GHz. If desired, circuitry 28 may support communications at multiple frequency bands between 10 GHz and 300 GHz such as a first band from 27.5 GHz to 28.5 GHz, a second band from 37 GHz to 41 GHz, and a third band from 57 GHz to 71 GHz, or other communications bands between 10 GHz and 300 GHz. Circuitry 28 may be formed from one or more integrated circuits (e.g., multiple integrated circuits mounted on a common printed circuit in a system-in-package device, one or more integrated circuits mounted on different substrates, etc.). While circuitry 28 is sometimes referred to herein as millimeter wave transceiver circuitry 28, millimeter wave transceiver circuitry 28 may handle communications at any desired communications bands at frequencies between 10 GHz and 300 GHz (e.g., in millimeter wave communications bands, centimeter wave communications bands, etc.).

Wireless communications circuitry 34 may include satellite navigation system circuitry such as Global Positioning System (GPS) receiver circuitry 22 for receiving GPS signals at 1575 MHz or for handling other satellite positioning data (e.g., GLONASS signals at 1609 MHz). Satellite navigation system signals for receiver 22 are received from a constellation of satellites orbiting the earth.

In satellite navigation system links, cellular telephone links, and other long-range links, wireless signals are typically used to convey data over thousands of feet or miles. In WiFi® and Bluetooth® links at 2.4 and 5 GHz and other short-range wireless links, wireless signals are typically used to convey data over tens or hundreds of feet. Extremely high frequency (EHF) wireless transceiver circuitry 28 may convey signals over these short distances that travel between transmitter and receiver over a line-of-sight path. To enhance signal reception for millimeter and centimeter wave communications, phased antenna arrays and beam steering techniques may be used (e.g., schemes in which antenna signal phase and/or magnitude for each antenna in an array is adjusted to perform beam steering). Antenna diversity schemes may also be used to ensure that the antennas that have become blocked or that are otherwise degraded due to the operating environment of device 10 can be switched out of use and higher-performing antennas used in their place.

Wireless communications circuitry 34 can include circuitry for other short-range and long-range wireless links if desired. For example, wireless communications circuitry 34 may include circuitry for receiving television and radio signals, paging system transceivers, near field communications (NFC) circuitry, etc.

Antennas 40 in wireless communications circuitry 34 may be formed using any suitable antenna types. For example, antennas 40 may include antennas with resonating elements that are formed from loop antenna structures, patch antenna structures, inverted-F antenna structures, slot antenna structures, planar inverted-F antenna structures, monopoles, dipoles, helical antenna structures, Yagi (Yagi-Uda) antenna structures, hybrids of these designs, etc. If desired, one or more of antennas 40 may be cavity-backed antennas. Different types of antennas may be used for different bands and combinations of bands. For example, one type of antenna may be used in forming a local wireless link antenna and another type of antenna may be used in forming a remote wireless link antenna. Dedicated antennas may be used for receiving satellite navigation system signals or, if desired, antennas 40 can be configured to receive both satellite navigation system signals and signals for other communications bands (e.g., wireless local area network signals and/or cellular telephone signals). Antennas 40 can include phased antenna arrays for handling millimeter wave communications.

As shown in FIG. 1, device 10 may include a housing such as housing 12. Housing 12, which may sometimes be referred to as an enclosure or case, may be formed of plastic, glass, ceramics, fiber composites, metal (e.g., stainless steel, aluminum, metallic coatings on a substrate, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Antennas 40 may be mounted in housing 12. Dielectric-filled openings such as plastic-filled openings may be formed in metal portions of housing 12 (e.g., to serve as antenna windows and/or to serve as gaps that separate portions of antennas 40 from each other).

In scenarios where input-output devices 18 include a display, the display may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. The display may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies. The display may be protected using a display cover layer such as a layer of transparent glass, clear plastic, sapphire, or other transparent dielectric. If desired, some of the antennas 40 (e.g., antenna arrays that may implement beam steering, etc.) may be mounted under an inactive border region of the display. The display may contain an active area with an array of pixels (e.g., a central rectangular portion). Inactive areas of the display are free of pixels and may form borders for the active area. If desired, antennas may also operate through dielectric-filled openings elsewhere in device 10.

If desired, housing 12 may include a conductive rear surface. The rear surface of housing 12 may lie in a plane that is parallel to a display of device 10. In configurations for device 10 in which the rear surface of housing 12 is formed from metal, it may be desirable to form parts of peripheral conductive housing structures as integral portions of the housing structures forming the rear surface of housing 12. For example, a rear housing wall of device 10 may be formed from a planar metal structure, and portions of peripheral housing structures on the sides of housing 12 may be formed as vertically extending integral metal portions of the planar metal structure. Housing structures such as these may, if desired, be machined from a block of metal and/or may include multiple metal pieces that are assembled together to form housing 12. The planar rear wall of housing 12 may have one or more, two or more, or three or more portions. The peripheral housing structures and/or the conductive rear wall of housing 12 may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating layers that may include dielectric materials such as glass, ceramic, plastic, or other structures that form the exterior surfaces of device 10 and/or serve to hide internal structures from view of the user).

Transmission line paths may be used to route antenna signals within device 10. For example, transmission line paths may be used to couple antenna structures 40 to transceiver circuitry 20. Transmission lines in device 10 may be integrated into rigid and/or flexible printed circuit boards. In one suitable arrangement, transmission lines in device 10 may also include transmission line conductors (e.g., signal and ground conductors) integrated within multilayer laminated structures (e.g., layers of a conductive material such as copper and a dielectric material such as a resin that are laminated together without intervening adhesive) that may be folded or bent in multiple dimensions (e.g., two or three dimensions) and that maintains a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive). Transmission lines in device 10 may include coaxial cable paths, microstrip transmission lines, stripline transmission lines, edge-coupled microstrip transmission lines, edge-coupled stripline transmission lines, waveguide structures for conveying signals at millimeter wave frequencies, transmission lines formed from combinations of transmission lines of these types, etc. Filter circuitry, switching circuitry, impedance matching circuitry, and other circuitry may be interposed within the transmission lines, if desired.

Device 10 may contain multiple antennas 40. The antennas may be used together or one of the antennas may be switched into use while other antenna(s) are switched out of use. If desired, control circuitry 14 may be used to select an optimum antenna to use in device 10 in real time and/or to select an optimum setting for adjustable wireless circuitry associated with one or more of antennas 40. Antenna adjustments may be made to tune antennas to perform in desired frequency ranges, to perform beam steering with a phased antenna array, and to otherwise optimize antenna performance. Sensors may be incorporated into antennas 40 to gather sensor data in real time that is used in adjusting antennas 40.

In some configurations, antennas 40 may include antenna arrays (e.g., phased antenna arrays to implement beam steering functions). For example, the antennas that are used in handling millimeter wave signals for extremely high frequency wireless transceiver circuitry 28 may be implemented as phased antenna arrays. The radiating elements in a phased antenna array for supporting millimeter wave communications may be patch antennas, dipole antennas, or other suitable antenna elements. Transceiver circuitry 28 can be integrated with the phased antenna arrays to form integrated phased antenna array and transceiver circuit modules or packages if desired.

In devices such as handheld devices, the presence of an external object such as the hand of a user or a table or other surface on which a device is resting has a potential to block wireless signals such as millimeter wave signals. In addition, millimeter wave communications typically require a line of sight between antennas 40 and the antennas on an external device. Accordingly, it may be desirable to incorporate multiple phased antenna arrays into device 10, each of which is placed in a different location within or on device 10. With this type of arrangement, an unblocked phased antenna array may be switched into use and, once switched into use, the phased antenna array may use beam steering to optimize wireless performance. Similarly, if a phased antenna array does not face or have a line of sight to an external device, another phased antenna array that has line of sight to the external device may be switched into use and that phased antenna array may use beam steering to optimize wireless performance. Configurations in which antennas from one or more different locations in device 10 are operated together may also be used (e.g., to form a phased antenna array, etc.).

Figure 2:
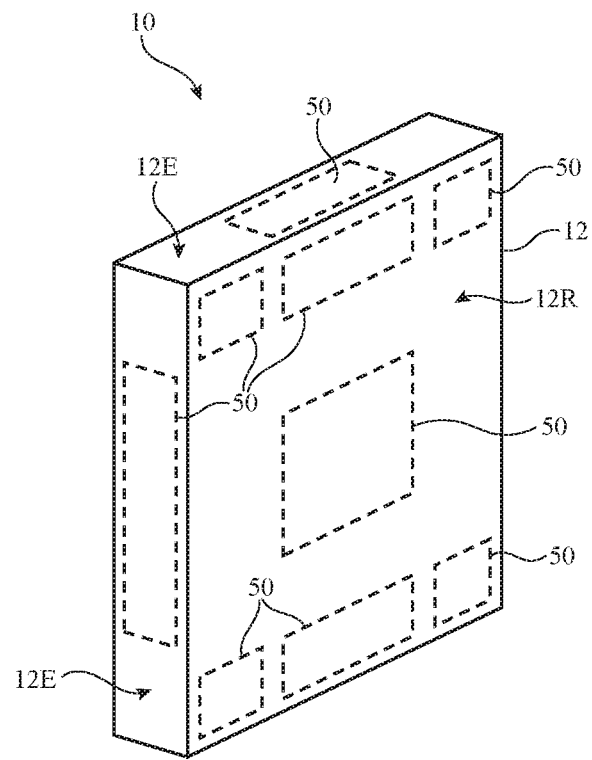
FIGS. 2 and 3 are perspective views of an illustrative electronic device showing locations at which phased antenna arrays for millimeter wave communications may be located in accordance with an embodiment.

FIG. 2 is a perspective view of electronic device 10 showing illustrative locations 50 at which antennas 40 (e.g., single antennas and/or phased antenna arrays for use with wireless circuitry 34 such as millimeter wave wireless transceiver circuitry 28) may be mounted in device 10. As shown in FIG. 2, housing 12 of device 10 may include rear housing wall 12R and housing sidewalls 12E. In one suitable arrangement, a display may be mounted to the side of housing 12 opposing rear housing wall 12R.

Antennas 40 (e.g., single antennas 40 or arrays of antennas 40) may be mounted at locations 50 at the corners of device 10, along the edges of housing 12 such as on sidewalls 12E, on the upper and lower portions of rear housing portion 12R, in the center of rear housing 12 (e.g., under a dielectric window structure such as a plastic logo), etc. In configurations in which housing 12 is formed from a dielectric, antennas 40 may transmit and receive radio-frequency signals through the dielectric, may be formed from conductive structures patterned directly onto the dielectric, or may be formed on dielectric substrates (e.g., flexible printed circuit board substrates) formed on the dielectric. In configurations in which housing 12 is formed from a conductive material such as metal, slots or other openings may be formed in the metal that are filled with plastic or other dielectric. Antennas 40 may be mounted in alignment with the dielectric (i.e., the dielectric in housing 12 may serve as one or more antenna windows for antennas 40) or may be formed on dielectric substrates (e.g., flexible printed circuit board substrates) mounted to external surfaces of housing 12.

Figure 3:
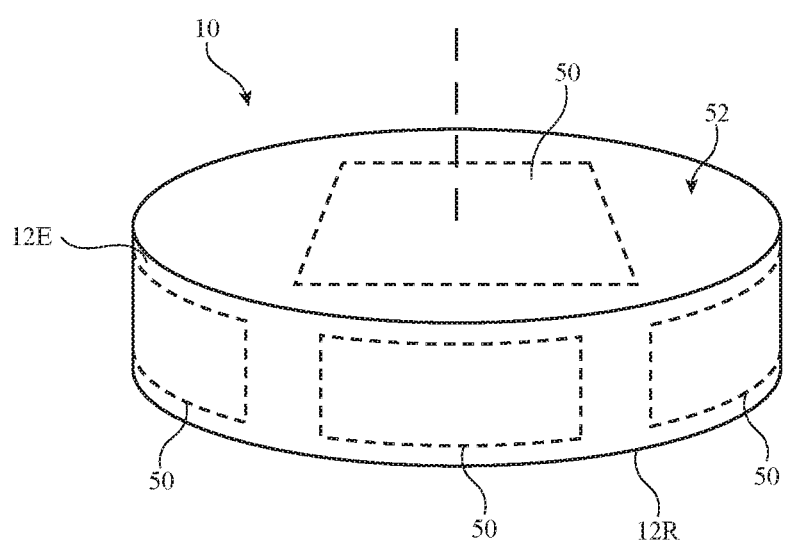

In the example of FIG. 2, rear housing wall 12R has a rectangular periphery. Housing sidewalls 12E surround the rectangular periphery of wall 12R and extend from wall 12R to the opposing face of device 10. In another suitable arrangement, device 10 and housing 12 may have a cylindrical shape. As shown in FIG. 3, rear housing wall 12R has a circular or elliptical periphery. Rear housing wall 12R may oppose surface 52 of device 10. Surface 52 may be formed from a portion of housing 12, may be formed from a display or transparent display cover layer, or may be formed using any other desired device structures. Housing sidewall 12E may extend between surface 52 and rear housing wall 12R. Antennas 40 may be mounted at locations 50 along housing sidewall 12E, on surface 52, and/or on wall 12R. By forming phased antenna arrays at different locations along wall 12E, on surface 52 (sometimes referred to herein as housing surface 52), and/or on rear housing wall 12R (e.g., as shown in FIGS. 2 and 3), the different phased antenna arrays on device 10 may collectively provide line of sight coverage to any point on a sphere surrounding device 10 (or on a hemisphere surrounding device 10 in scenarios where phased antenna arrays are only formed on one side of device 10).

The examples of FIGS. 2 and 3 are merely illustrative. In general, housing 12 and device 10 may have any desired shape or form factor. For example, rear housing wall 12R may have a triangular periphery, hexagonal periphery, polygonal periphery, a curved periphery, combinations of these, etc. Housing sidewall 12E may include straight portions, curved portions, stepped portions, combinations of these, etc. If desired, housing 12 may include other portions having any other desired shapes. The height of sidewall 12E may be less than, equal to, or greater than the length and/or width of housing rear wall 12R.

Figure 4:
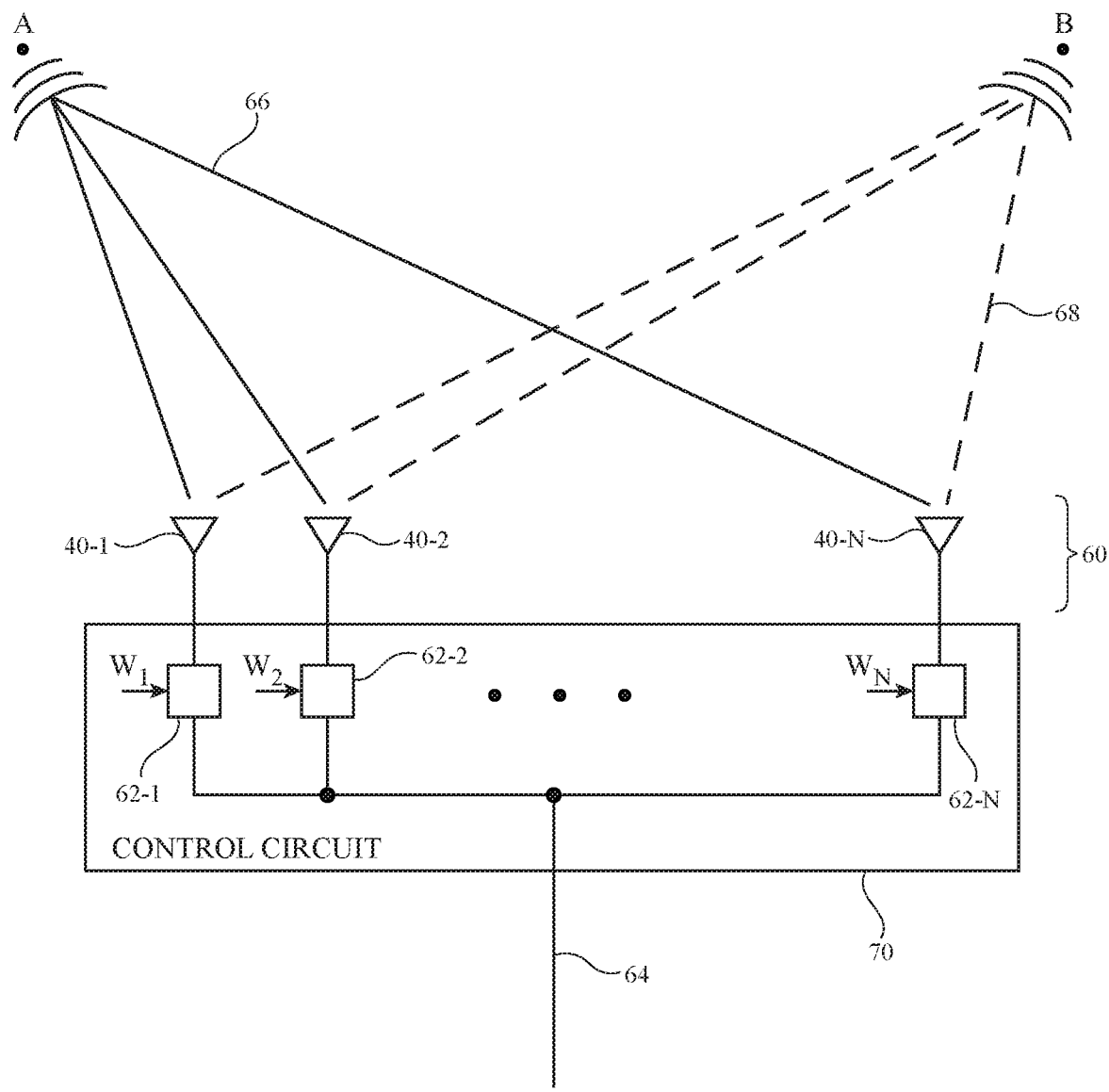
FIG. 4 is a diagram of an illustrative phased antenna array that may be adjusted using control circuitry to direct a beam of signals in accordance with an embodiment.

FIG. 4 shows how antennas 40 on device 10 may be formed in a phased antenna array. As shown in FIG. 4, phased antenna array 60 (sometimes referred to herein as array 60, antenna array 60, and array 60 of antennas 40) may be coupled to a signal path such as path 64 (e.g., one or more radio-frequency transmission line structures, extremely high frequency waveguide structures or other extremely high frequency transmission line structures, etc.). Phased antenna array 60 may include a number N of antennas 40 (e.g., a first antenna 40-1, a second antenna 40-2, an Nth antenna 40-N, etc.). Antennas 40 in phased antenna array 60 may be arranged in any desired number of rows and columns or in any other desired pattern (e.g., the antennas need not be arranged in a grid pattern having rows and columns). During signal transmission operations, path 64 may be used to supply signals (e.g., millimeter wave signals) from millimeter wave transceiver circuitry 28 to phased antenna array 60 for wireless transmission to external wireless equipment. During signal reception operations, path 64 may be used to convey signals received at phased antenna array 60 from external equipment to millimeter wave transceiver circuitry 28.

The use of multiple antennas 40 in array 60 allows beam steering arrangements to be implemented by controlling the relative phases and amplitudes of the signals for the antennas. In the example of FIG. 4, antennas 40 each have a corresponding radio-frequency phase controller 62 (e.g., a first controller 62-1 coupled between signal path 64 and first antenna 40-1, a second controller 62-2 coupled between signal path 64 and second antenna 40-2, an Nth controller 62-N coupled between path 64 and Nth antenna 40-N, etc.).

Beam steering circuitry such as control circuitry 70 may use phase controllers 62 or any other suitable phase control circuitry to adjust the relative phases of the transmitted signals that are provided to each of the antennas in the antenna array and to adjust the relative phases of the received signals that are received by the antenna array from external equipment. The term "beam" or "signal beam" may be used herein to collectively refer to wireless signals that are transmitted and received by array 60 in a particular direction. The term "transmit beam" may sometimes be used herein to refer to wireless signals that are transmitted in a particular direction whereas the term "receive beam" may sometimes be used herein to refer to wireless signals that are received from a particular direction.

If, for example, control circuitry 70 is adjusted to produce a first set of phases on transmitted millimeter wave signals, the transmitted signals will form a millimeter wave frequency transmit beam as shown by beam 66 of FIG. 4 that is oriented in the direction of point A. If, however, control circuitry 70 adjusts phase controllers 62 to produce a second set of phases on the transmitted signals, the transmitted signals will form a millimeter wave frequency transmit beam as shown by beam 68 that is oriented in the direction of point B. Similarly, if control circuitry 70 adjusts phase controllers 62 to produce the first set of phases, wireless signals (e.g., millimeter wave signals in a millimeter wave frequency receive beam) may be received from the direction of point A as shown by beam 66. If control circuitry 70 adjusts phase controllers 62 to produce the second set of phases, signals may be received from the direction of point B, as shown by beam 68. Control circuit 70 may be controlled by control circuitry 14 of FIG. 1 or by other control and processing circuitry in device 10 if desired.

In one suitable arrangement, phase and magnitude controllers 62 may each include radio-frequency mixing circuitry. The phase and magnitude controllers may be referred to herein sometimes as controllers (e.g., controllers 62). Controllers 62 (e.g., mixing circuitry or mixers in controller 62) may receive signals from path 64 at a first input and may receive a corresponding signal weight value W at a second input (e.g., controller 62-1 may receive a first weight $W_1$, controller 62-2 may receive a second weight $W_2$, controller 62-N may receive an Nth weight $W_N$, etc.). Weight values W may, for example, be provided by control circuitry 14 (e.g., using corresponding control signals) or from other control circuitry. The mixer circuitry may mix (e.g., multiply) the signals received over path 64 with the corresponding signal weight value to produce an output signal that is transmitted on the corresponding antenna. For example, a signal S may be provided to phase controllers 62 over path 64. Controller 62-1 may output a first output signal $S*W_1$ that is transmitted on first antenna 40-1, controller 62-2 may output a second output signal $S*W_2$ that is transmitted on second antenna 40-2, etc. The output signals transmitted by each antenna may constructively and destructively interfere to generate a beam of signals in a particular direction (e.g., in a direction as shown by beam 66 or a direction as shown by beam 68). Similarly, adjusting weights W may allow for millimeter wave signals to be received from a particular direction and provided to path 64. Different combinations of weights W provided to each mixer will steer the signal beam in different desired directions. If desired, control circuit 70 may actively adjust weights W provided to controllers 62 in real time to steer the transmit or receive beam in desired directions.

When performing millimeter wave communications, millimeter wave signals are conveyed over a line of sight path between antenna array 60 and external equipment. If the external equipment is located at location A of FIG. 4, circuit 70 may be adjusted to steer the signal beam towards direction A. If the external equipment is located at location B, circuit 70 may be adjusted to steer the signal beam towards direction B. In the example of FIG. 4, beam steering is shown as being performed over a single degree of freedom for the sake of simplicity (e.g., towards the left and right on the page of FIG. 4). However, in practice, the beam is steered over two degrees of freedom (e.g., in three dimensions, into and out of the page and to the left and right on the page of FIG. 4).

Figure 5:
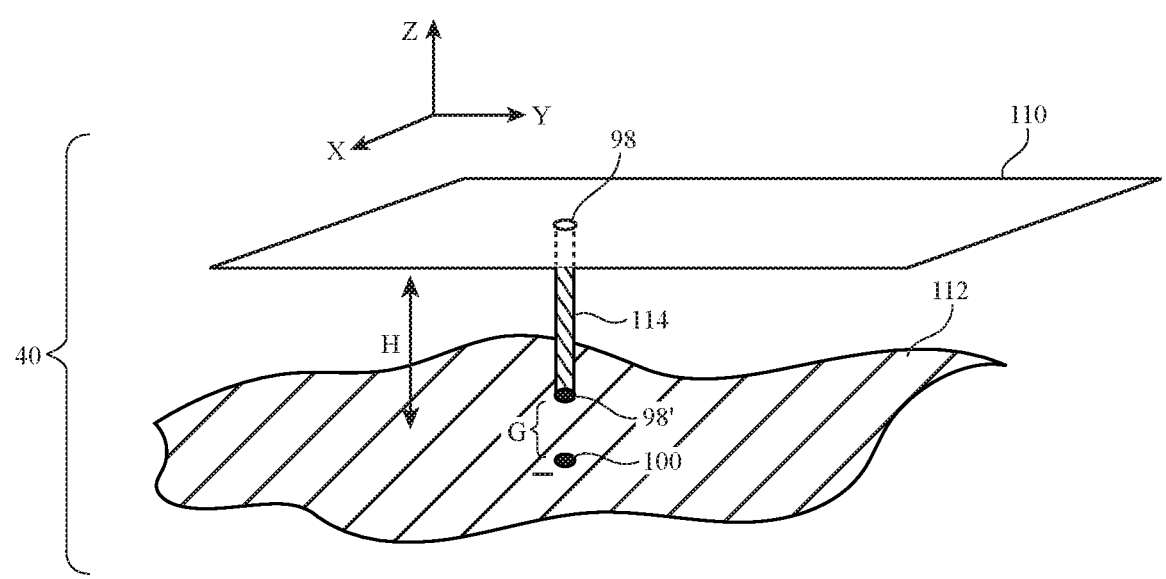
FIG. 5 is a perspective view of an illustrative patch antenna in accordance with an embodiment.

Any desired antenna structures may be used for implementing antenna 40. For example, patch antenna structures may be used for implementing antenna 40. An illustrative patch antenna is shown in FIG. 5. As shown in FIG. 5, patch antenna 40 may have a patch antenna resonating element such as patch 110 that is separated from a ground plane structure such as ground 112. Antenna patch resonating element 110 and ground 112 may be formed from metal foil, machined metal structures, metal traces on a printed circuit or a molded plastic carrier, electronic device housing structures, or other conductive structures in an electronic device such as device 10.

Antenna patch resonating element 110 may lie within a plane such as the X-Y plane of FIG. 5. Ground 112 may lie within a plane that is parallel to the plane of antenna patch resonating element (patch) 110. Patch 110 and ground 112 may therefore lie in separate parallel planes that are separated by a distance H. Conductive path 114 may be used to couple terminal 98' to terminal 98. Antenna 40 may be fed using a transmission line with positive conductor coupled to terminal 98' and thus terminal 98 and with a ground conductor coupled to terminal 100. Other feeding arrangements may be used if desired. Moreover, patch 110 and ground 112 may have different shapes and orientations (e.g., planar shapes, curved patch shapes, patch element shapes with non-rectangular outlines, shapes with straight edges such as squares, shapes with curved edges such as ovals and circles, shapes with combinations of curved and straight edges, etc.).

Figure 6:
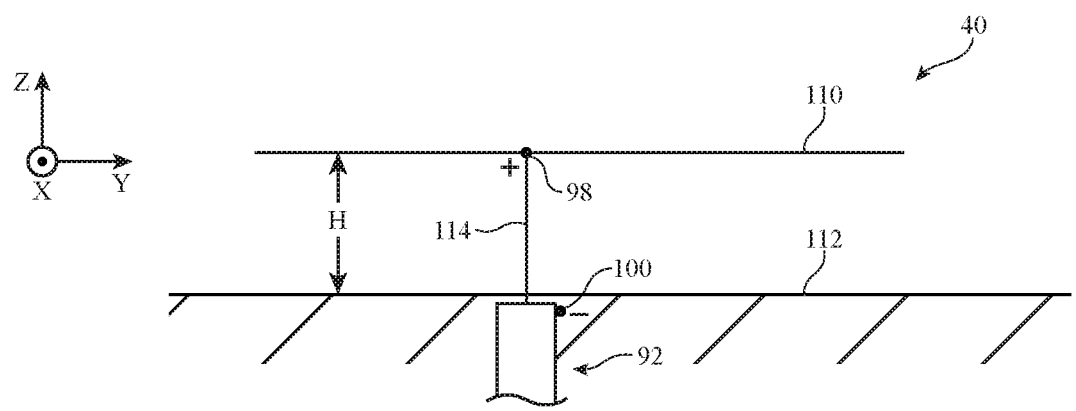
FIG. 6 is a side view of an illustrative patch antenna in accordance with an embodiment.

A side view of a patch antenna such as patch antenna 40 of FIG. 5 is shown in FIG. 6. As shown in FIG. 6, antenna 40 may be fed using an antenna feed (with terminals 98 and 100) that is coupled to a transmission line such as transmission line 92. Patch element 110 of antenna 40 may lie in a plane parallel to the X-Y plane of FIG. 6 and the surface of the structures that form a ground (i.e., ground 112) may lie in a plane that is separated by vertical distance H from the plane of element 110. With the illustrative feeding arrangement of FIG. 6, a ground conductor of transmission line 92 is coupled to antenna feed terminal 100 on ground 112 and a positive conductor of transmission line 92 is coupled to antenna feed terminal 98 via an opening in ground 112 and conductive path 114 (which may be an extended portion of the positive conductor). Other feeding arrangements may be used if desired (e.g., feeding arrangements in which a microstrip transmission line in a printed circuit or other transmission line that lies in a plane parallel to the X-Y plane is coupled to terminals 98 and 100, etc.). To enhance the frequency coverage and polarizations handled by patch antenna 40, antenna 40 may be provided with multiple feeds (e.g., two feeds) if desired. These examples are merely illustrative and, in general, the patch antenna resonating elements may have any desired shape. Other types of antennas may be used if desired.

Figure 7:
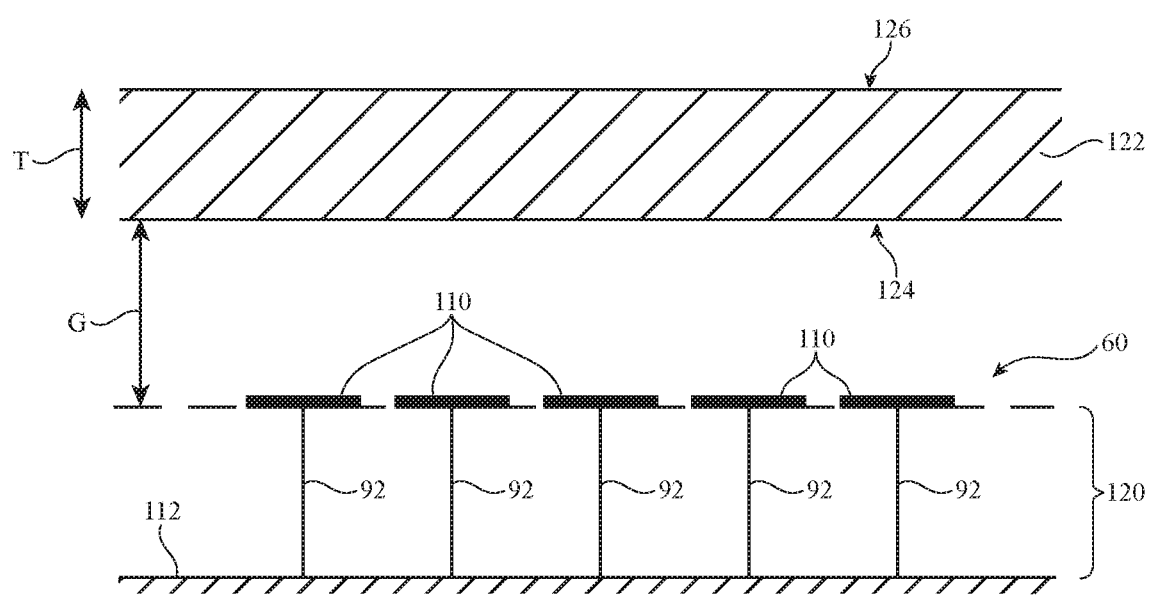
FIG. 7 is a cross-sectional side view of an illustrative planar dielectric cover formed over an antenna array in accordance with an embodiment.

Antennas of the types shown in FIGS. 5 and 6 and/or other types of antennas may be arranged in a phased antenna array such as phased antenna array 60 of FIG. 4. FIG. 7 is a cross-sectional side view of an illustrative phased antenna array 60 formed from a pattern of patch antennas (e.g., antennas of the types shown in FIGS. 5 and 6). As shown in FIG. 7, multiple patch antennas 40 may be arranged in antenna array 60. Antenna resonating elements 110 (sometimes referred to herein as antenna elements 110, elements 110, patch elements 110, or resonating elements 110) of respective patch antennas 40 may be formed at different locations over ground plane 112. While FIG. 7 shows a side view of array 60, array 60 may have patch antennas arranged in a two-dimensional grid pattern (e.g., arranged in a rectangular array pattern of rows and columns, arranged in a 5×5 array, etc.) or any other desired pattern. While FIG. 7 shows five patch antennas, this is merely illustrative. If desired, any number of patch antennas may be formed in array 60. The example of antenna elements 110 being patch antenna elements is merely illustrative. Antenna resonating elements 110 may be dipole antenna resonating elements, Yagi antenna resonating elements, or antenna resonating elements of any other desired type.

Respective transmission lines 92 may each couple a corresponding patch element 110 to transceiver circuitry 28. Transmission lines 92 may also couple transceiver circuitry 28 to ground 112. As an example, ground 112 may be shared between multiple antenna elements 110 in FIG. 7. Elements 110 may be formed on a dielectric substrate such as substrate 120. Substrate 120 may be a printed circuit, plastic support structure, or any other suitable structure on which elements 110 may be formed.

As previously described, array 60 may be located at any desired location 50 in FIGS. 2 and 3, for example. In order to protect array 60 from damage, dust, water, and other contaminants and for the purposes of mechanical reliability of the antenna assembly, a dielectric cover layer such as cover layer 122 may be formed over array 60. The dielectric properties and the geometry of cover layer 122 may affect the radiation characteristics of array 60. Cover 122 may sometimes be referred to herein as a radome, cover layer, dielectric cover, or dielectric cover layer.

As shown in FIG. 7, cover layer 122 may be separated from patch elements 110 of array 60 by a gap such as gap G. Gap G may be filled with a dielectric material such as plastic, foam, air, etc. Cover 122 may be formed from any desired dielectric material. As examples, cover 122 may be formed from plastic, glass, ceramics, fiber composites, a combination of two or more of these materials, or any other suitable materials. Cover 122 may be formed from a portion of housing 12 (e.g., from a dielectric antenna window portion of housing 12 or other dielectric portions of housing 12) or any other dielectric structures of device 10. If desired, some or all of cover 122 may be formed from internal structures within device 10 (e.g., internal printed circuits, dielectric support structures, etc.) as an example.

In the example of FIG. 7, dielectric cover 122 has a uniform thickness T across the lateral area of array 60. Thickness T may be defined by planar lower surface 124 and planar upper surface 126. Surfaces 124 and 126 may lie in parallel planes with respect to a surface of elements 110, a surface of substrate 120, and/or a surface of ground 112. As an example, cover 122 may completely encapsulate elements 110 and/or a top surface of substrate 120. In other words, cover 122 and substrate 120 may form a closed cavity in which elements 110 are located. Surface 124 may sometimes be referred to herein as an inner surface, whereas surface 126 may sometimes be referred to herein as an outer surface (e.g., because inner surface 124 faces antennas 40 whereas outer surface 126 may, in some scenarios, be formed at the exterior of device 10).

During operation of antennas 40 in array 60, the transmission and reception of signals such as millimeter wave signals may be affected by the presence of cover 122 (e.g., by the geometry of cover 122 with respect to elements 110 and by the dielectric properties of cover 122). In particular, signals generated by array 60 may be reflected at the air-solid interfaces of cover 122 (e.g., at surfaces 124 and 126 which may be referred to as air-solid interface surfaces 124 and 126, interfacial surfaces 124 and 126, or interfaces 124 and 126). As a result, only a portion of signals generated by array 60 may be transmitted through cover 122. Additionally, the reflected portion of the transmit signals of array 60 may distort other transmit signals of array 60 (e.g., reflected signals that are 180 degrees out of phase with transmitted signals may destructively interfere with the transmitted signals). For example, if care is not taken, in the presence of flat cover 122 in FIG. 7 the peak gain of the signals transmitted by array 60 may be deteriorated, the radiation pattern of the signals generated by array 60 may be narrowed (e.g., to provide an excessively small wireless coverage area), the radiation pattern of the signals generated by array 60 may be otherwise distorted, etc. It may therefore be desirable to provide dielectric covers that can mitigate these adverse effects.

In the example of FIG. 7, the size of gap G may be selected, the thickness of cover 122 may be selected, and/or the dielectric material used to form cover 122 may be selected to minimize these adverse effects. In particular, thickness of cover 122 may be an optimal thickness such that the respective reflected signals generated at surfaces 124 and 126 interfere with each other destructively (e.g., cancel each other out). In other words, out-of-phase reflected signals (e.g., signals that have an approximately 180-degree phase difference with respect to each other) generated at surface 124 and 126 may cancel each other out. The optimal thickness in this example may be determined by the wavelength of the signals propagating through cover 122 and the dielectric constant of cover 122. As an example, an optimal thickness of cover 122 may be the wavelength of operation of array 60 divided by two, or any other desired thickness that minimizes distortion of the radiation pattern. However, in some configurations it may be difficult to select the size of gap G and type of dielectric material 122 to sufficiently mitigate these effects. Additionally, the planar inner surface 124 of cover 122 may receive incident signals transmitted by array 60 at relatively high incident angles (e.g., at an angle close to parallel with respect to interfacial surfaces 124 and 126), which can be more conducive to interfacial reflection of the incident signals than for signals that reach the interfacial surfaces at relatively low incident angles (e.g., at an angle close to parallel with the normal axis of surfaces 124 and 126).

In order to mitigate the distortion of the radiation pattern for wireless radio-frequency signals by the dielectric cover, the dielectric cover may include one or more curved inner surfaces. The curved inner surfaces may help to reduce the incident angle of the signal beam generated by steering array 60. This consequently lowers interfacial reflection of the incident signals, resulting in the transmission of more of the wireless radio-frequency signals through the dielectric cover relative to scenarios where the dielectric cover has a planar inner surface (e.g., cover 122 in FIG. 7).

Figure 8:
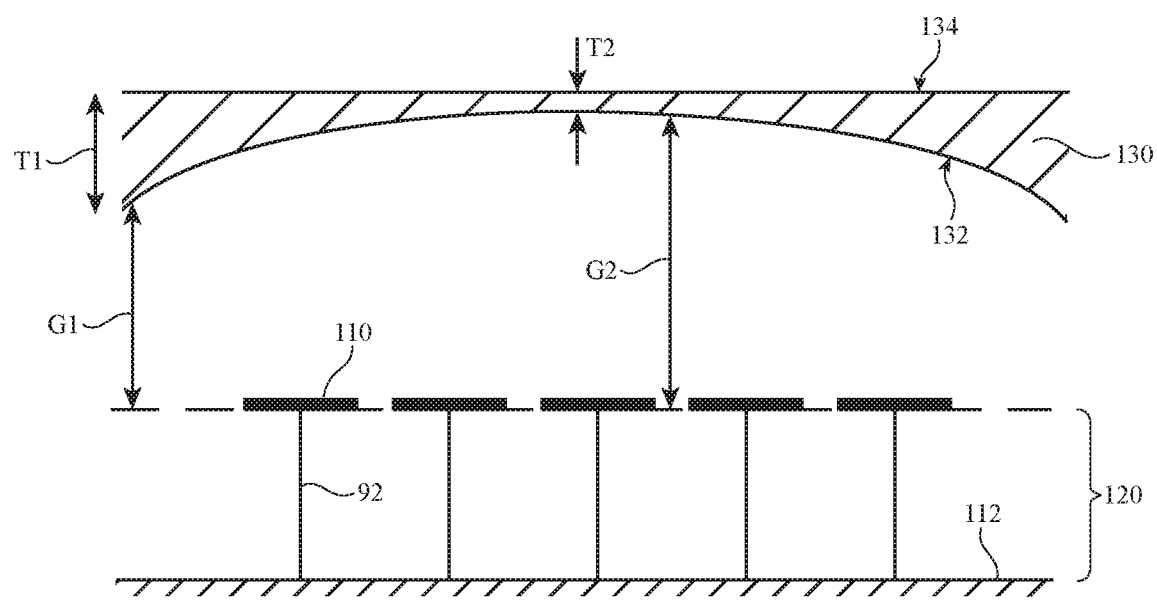
FIG. 8 is a cross-sectional side view of an illustrative dielectric cover having a curved inner surface formed over an antenna array in accordance with an embodiment.

As an example, FIG. 8 shows a cross-sectional side view of an illustrative dielectric cover 130 (e.g., dielectric cover layer 130) for array 60 that has a curved inner surface such as curved inner surface 132 and planar outer surface 134. Curved inner surface 132 may, for example, have a spherical curvature, an elliptical curvature, or any other desired type of curvature. Because inner surface 132 is curved, cover 130 may exhibit a variable thickness across its lateral area. For example, the edge portions (in the side view in FIG. 8) of cover 130 around the periphery of array 60 may be thicker than a center portion of cover 130 over the center of array 60. In other words, thickness T1 at the edges of cover 130 may be greater than thickness T2 at the center of cover 130. Consequently, elements 110 may be separated from cover 130 by a larger gap G2 near the center of array 60 and separated by a smaller gap G1 near the edges of array 60. This is merely illustrative. If desired, curved inner surface 132 may have a convex curve or any other suitable curvature.

Curved inner surface 132 of cover 130 may help to lower the incident angles at which signals transmitted by patch antennas 40 reach surface 132. By lowering the incident angle of the transmit signals, interface reflection at surface 132 may be decreased and consequently a larger portion of the radio-frequency signals (e.g., millimeter wave signals) generated by array 60 may be transmitted through cover 130 than if a dielectric cover having a planar inner surface was used. Additionally, surface 132 of cover 130 may function as a concave lens for antennas 40 in array 60 and help broaden the radiation pattern of the signal beam transmitted by array 60.

The dielectric cover and antenna array may be placed at various locations within or on electronic device 10 that are adjacent to other internal structures or device housing structures. In order to adapt to the confines of the adjacent internal structures and/or housing structures (e.g., to the form factor of device 10) while minimizing high incident-angle reflections at the surfaces of the cover, both the inner surface and the outer surface of a dielectric cover may have curved surfaces.

Figure 9:
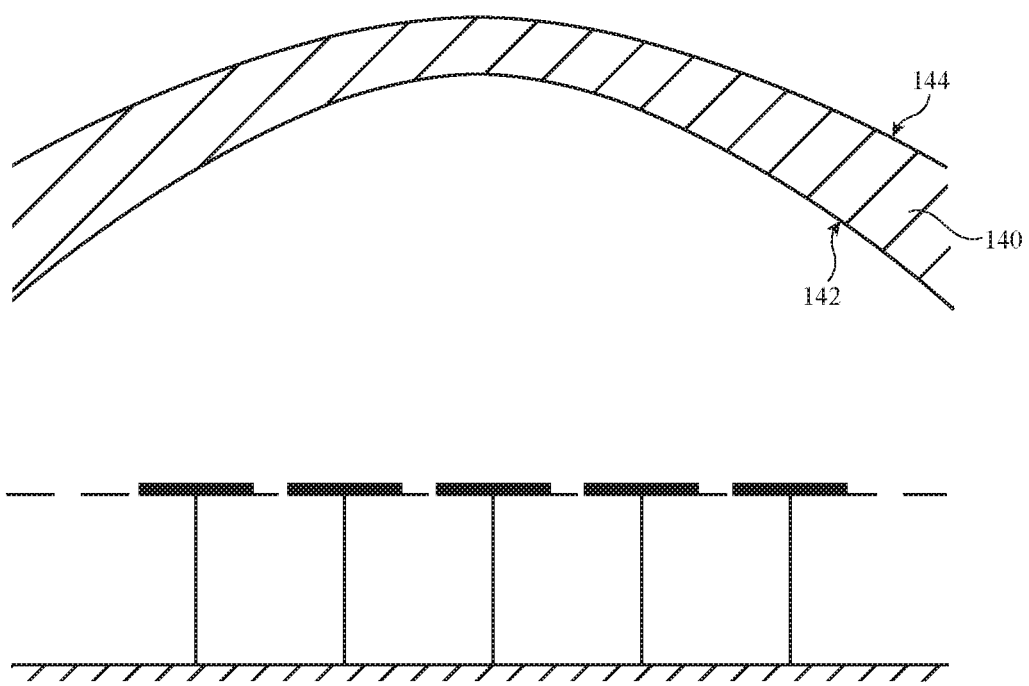
FIG. 9 is a cross-sectional side view of an illustrative dielectric cover having curved inner and outer surfaces formed over an antenna array in accordance with an embodiment.

As an example, FIG. 9 shows a cross-sectional side view of dielectric cover 140 (e.g., dielectric cover layer 140) having curved lower surface 142 and curved upper surface 144. In the example of FIG. 8, the curvature of lower surface 132 of cover 130 may be limited by planar upper surface 134 (e.g., a portion of lower surface 132 cannot extend beyond or above a portion of planar upper surface 134). Because upper surface 144 of cover 140 may be curved in the example of FIG. 9, the curvature of lower surface 142 may be selected from a wider range of curvatures than the lower surface in the example of FIG. 8. The curvature of upper surface 144 may be adjusted according to a desired curvature of lower surface 142. In general, as the curvature of lower surface 142 increases (e.g., as the radius of curvature of lower surface 142 decreases), the incident angle of the millimeter wave signals at surface 142 reduces over the field of view of array 60, thereby reducing the amount of corresponding reflected signals. If desired, inner and outer surfaces 142 and 144 may be concentric surfaces. Alternatively, outer surface 144 may adapt (conform) to the shape of adjacent structures within electronic device 10 and inner surface 142 may be configured to have the highest curvature possible (e.g., the most parabolic curvature, the smallest radius of curvature) as permitted by the conformal outer surface 144. These examples are merely illustrative. If desired, surfaces 142 and 144 may have any curvatures. As another example, surface 142 may have a first radius of curvature and surface 144 may have a second radius of curvature that is greater than or equal to the first radius of curvature.

Although cover 140 of FIG. 9 allows for a highly parabolic inner surface (e.g., an inner surface that permits large amounts of wireless radio-frequency signals to pass), the outer surface would have a large protrusion to accommodate the curvature of the inner surface. In other words, cover 140 may occupy significant space within electronic device 10. In order to balance space constraints within electronic device 10 with providing the dielectric cover with a high curvature inner surface, the inner surface of the dielectric cover may be provided with multiple sets of openings or cavities (e.g., multiple different localized curvatures).

Figure 10:
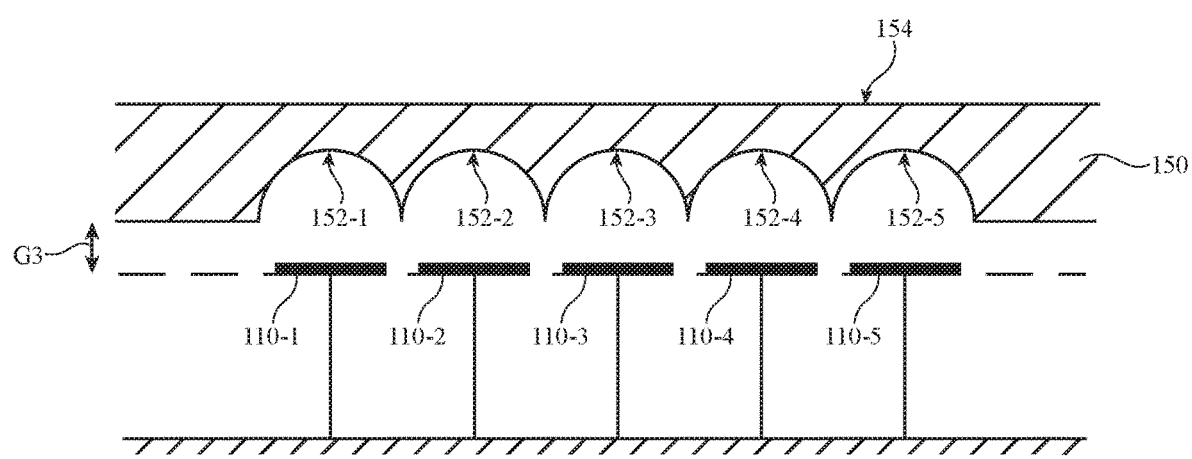
FIG. 10 is a cross-sectional side view of an illustrative dielectric cover having multiple cavities for respective antennas in an antenna array in accordance with an embodiment.

As an example, FIG. 10 shows a cross-sectional side view of a dielectric cover (e.g., dielectric cover layer 150) that includes multiple discrete cavities (e.g., corresponding cavities or curvatures 152 for respective antenna elements 110 on array 60). Each cavity 152 may be defined by a separate curvature on the inner surface of cover 150 (e.g., each cavity 152 may have a respective radius of curvature about a different respective point below cover 150 and above elements 110). Cavities 152 may sometimes be referred to herein as recesses, notches, grooves, curvatures, or portions of the lower surface of cover 150. Cover 150 may have a planar surface 154. If desired, surface 154 and cavities at surface 152 may have any curvatures. As an example, cavities at surface 152 may have a first radius of curvature and surface 154 may have a second radius of curvature that is greater than or equal to the first radius of curvature.

As shown in FIG. 10, a first antenna element 110-1 may be aligned with a first cavity 152-1 in cover 150 (e.g., a first portion 152-1 of the lower surface of cover 150), a second antenna element 110-2 may be aligned with a second cavity 152-2 (e.g., a second portion 152-2 of the lower surface of cover 150), etc. First antenna element 110-1 may transmit and receive signals through the aligned cavity 152-1 in cover 150. Similarly, antenna elements 110-2 through 110-5 may transmit and receive signals via the corresponding aligned cavities 152-2 to 152-5, respectively. If desired, the surfaces of each portion 152 may be locally optimized to optimize passage of wireless signals for the corresponding aligned element 110. In other words, a given cavity 152 may act as an individualized lens for the corresponding antenna element 110 over which it is formed. The beam width associated with each individual antenna element 110 may be widened separately by the respective cavities 152, and consequently, the combined signals beam generated by the entire array 60 may also exhibit a widened beam width.

If desired, curved inner surface portions 152-1 through 152-5 may have the same shape or curvature. However, this is merely illustrative. Alternatively, some or all of inner surface portions 152-1 to 152-5 may have different curvatures suited for the respective antenna patch element the corresponding portion covers. In particular, one or more cavities 152 may have a spherical curvature, an elliptical curvature, or any desired curvature. A given cavity 152 in cover 150 may serve to reduce the incident angle (on the inner surface of cover 150) for radio-frequency signals transmitted by a corresponding antenna element 110 over which that cavity 152 is formed. A respective cavity 152 may be aligned with each element 110 in array 60 or, if desired, one or more cavities 152 in cover 150 may be shared by two or more antenna elements (e.g., may overlap with two or more aligned elements 110).

By providing separate curved inner surface portions for each patch element 110, cover 150 may be formed in closer proximity to substrate 120 and/or elements 110 than in scenarios where a single continuous curve is formed in the inner surface of the dielectric cover. In other words, gap G3 that separates the closest portions of cover 150 from substrate 120 may be smaller than gap G in FIG. 7 and gaps G1 and G2 in FIG. 8. By minimizing the thickness of the cover and antenna assembly (e.g., minimizing the combined thickness of the air gap and dielectric cover), a more compact dielectric cover than cover 140 in FIG. 7 may be provided within device 10, thereby providing additional space for other components within device 10, for example.

In scenarios where the design or shape of the outer surface of the dielectric cover is further constrained or limited by adjacent structures, the shape of the outer surface of the dielectric cover may be curved to conform to the shape of adjacent structures (or to the form factor of device 10). Consequently, the shape of the inner surface may be configured to be conformal to the outer surface of the dielectric cover.

Figure 11:
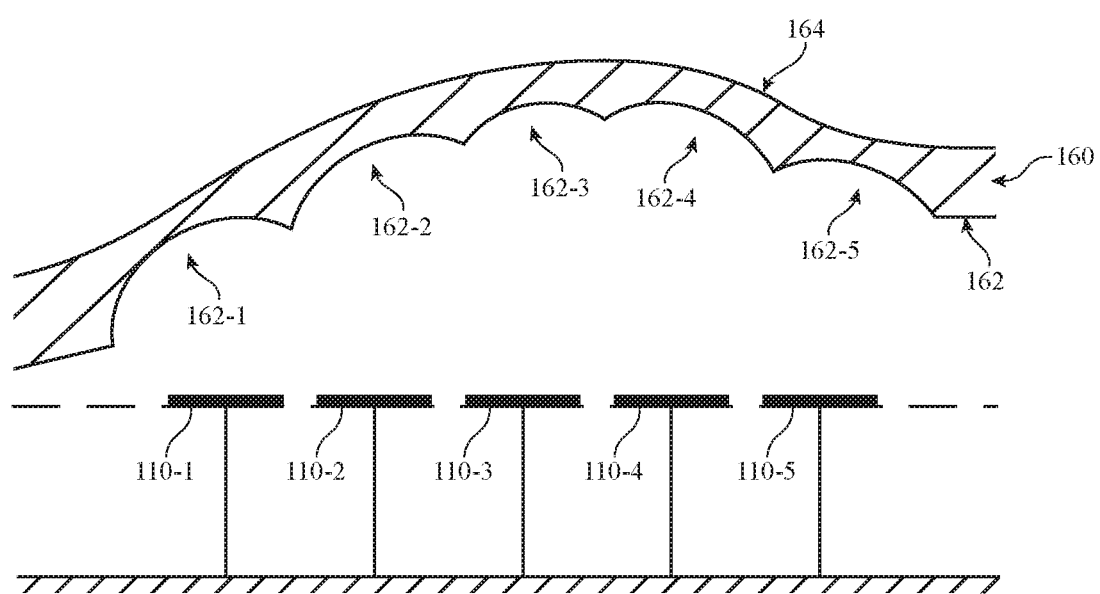
FIG. 11 is a cross-sectional side view of an illustrative dielectric cover having a curved outer surface and multiple cavities for respective antennas in an antenna array in accordance with an embodiment.

As an example, FIG. 11 shows a cross-sectional side view of dielectric cover 160 (e.g., dielectric cover layer 160) having curved outer surface 164 that may be conformal to an adjacent structure external to the dielectric cover and antenna array. For example, array 60 as shown in FIG. 11 may be formed at location 50 along a curved edge of device 10 in FIG. 3 (e.g., surface 164 may have a curve that conforms to the form factor of device 10). Surface 164 may be conformal to curved edge portions of housing 12 in FIG. 3, or cover 160 may form a curved portion of housing 12. This is merely illustrative. If desired, surface 164 may be conformal to any desired structures within device 10 (e.g., a curved antenna window, a curved substrate, a curved support structure, a display, etc.). In the example of FIG. 11, outer surface 164 has an asymmetric slope or shape. Bottom surface 162 may conform to the asymmetric slope of surface 164 or may have any other desired curvature. If desired, bottom surface 162 may additionally include cavities 162 that are aligned with corresponding antenna elements 110 (e.g., cavity 162-1 aligned with element 110-1, cavity 162-2 aligned with element 110-2, etc.). When configured in this way (as shown in FIG. 11), the inner surface of cover 160 may include multiple separate cavities 162 each having their own curvatures, where each cavity 162 is itself centered along a point that lies on a curve (e.g., a curve that extends parallel to or is conformal to the shape of surface 164).

Figure 12:
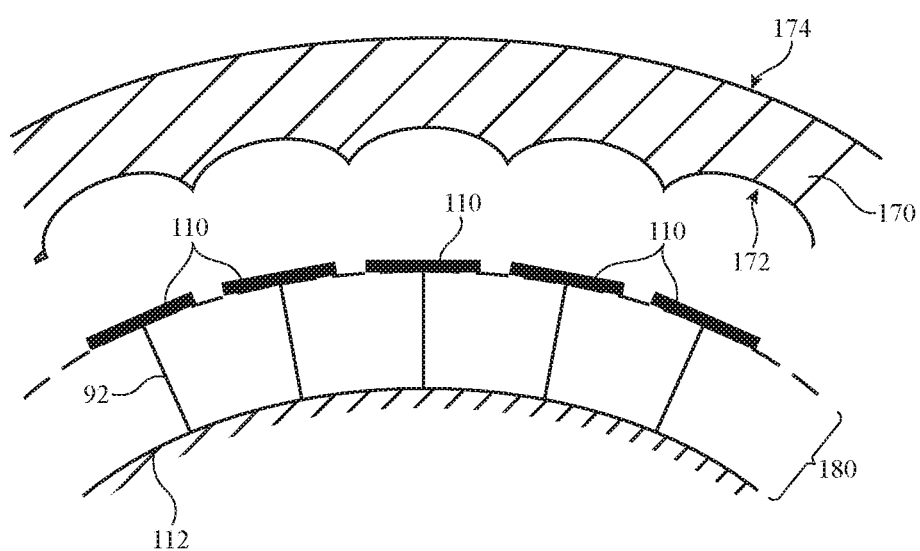
FIG. 12 is a cross-sectional side view of an illustrative dielectric cover formed over an antenna array on a curved surface in accordance with an embodiment.

In scenarios where antennas 40 on array 60 are formed on a bent substrate (e.g., a flexible substrate), a dielectric cover that is conformal to the bent substrate may be formed over antennas 40. As shown in FIG. 12, antennas 40 on array 60 may be formed on bent substrate 180 (e.g., a flexible printed circuit board substrate or some other substrate having a curved surface). For example, substrate 180 may be conformal to internal structures within device 10. Additionally, ground plane 112 may also have a non-planar surface to which transmission lines 92 are coupled. In scenarios where antenna elements 110 are formed on a bent surface (e.g., a bent top surface of substrate 180), cover 170 (e.g., cover layer 170) may also be bent to conform to the bent surface. As an example, outer surface 174 and/or the inner surface of cover 170 may have a bent shape that is parallel (e.g. concentric) with the bent shape of the bent surface of substrate 180 and/or ground plane 112. If desired, separate cavities 172 may be formed in the inner surface of cover 170 in alignment with corresponding antenna elements 110. Cavities 172 may also be formed along a curved path that is conformal to surface 174, if desired.

If desired, the dielectric covers shown in FIGS. 7-12 may be formed from one or more materials or portions that are adhered or attached to each other. For example, cover 130 of FIG. 8 may be formed from multiple materials (e.g., multiple stacked layers of materials). Cover 130 may be formed from a planar portion having a uniform thickness T2 at the edges and center of cover 130 (e.g., cover 122 in FIG. 7 having a uniform thickness T2) and two curved portions on the edges that are attached to the planar portion at the edges of cover 130. In particular, the thickness of a curved portion and the thickness of the planar portion may sum to edge thickness T1. In other words, two ramp-shaped portions (i.e., curved portions) may be attached to cover 122 in FIG. 7 to form cover 130, if desired. The curved portions and the planar portion of cover 130 may be formed from different materials or the same material. As an example, an adhesive may be used to attach the curved portions to the planar portion. This is merely illustrative. If desired, the curved portions and the planar portion may be fused together or formed from the same integral piece of dielectric material (e.g., the curves may be formed from etching or cutting a block of dielectric material). Similarly, cover 150 in FIG. 10 may also be formed from a planar portion (e.g., a portion of cover 150 may have uniform thickness) and multiple curved portions attached to the planar portion. In general, the dielectric covers shown in FIGS. 7-12 may be formed from any number of desired materials or portions.

Figure 13:
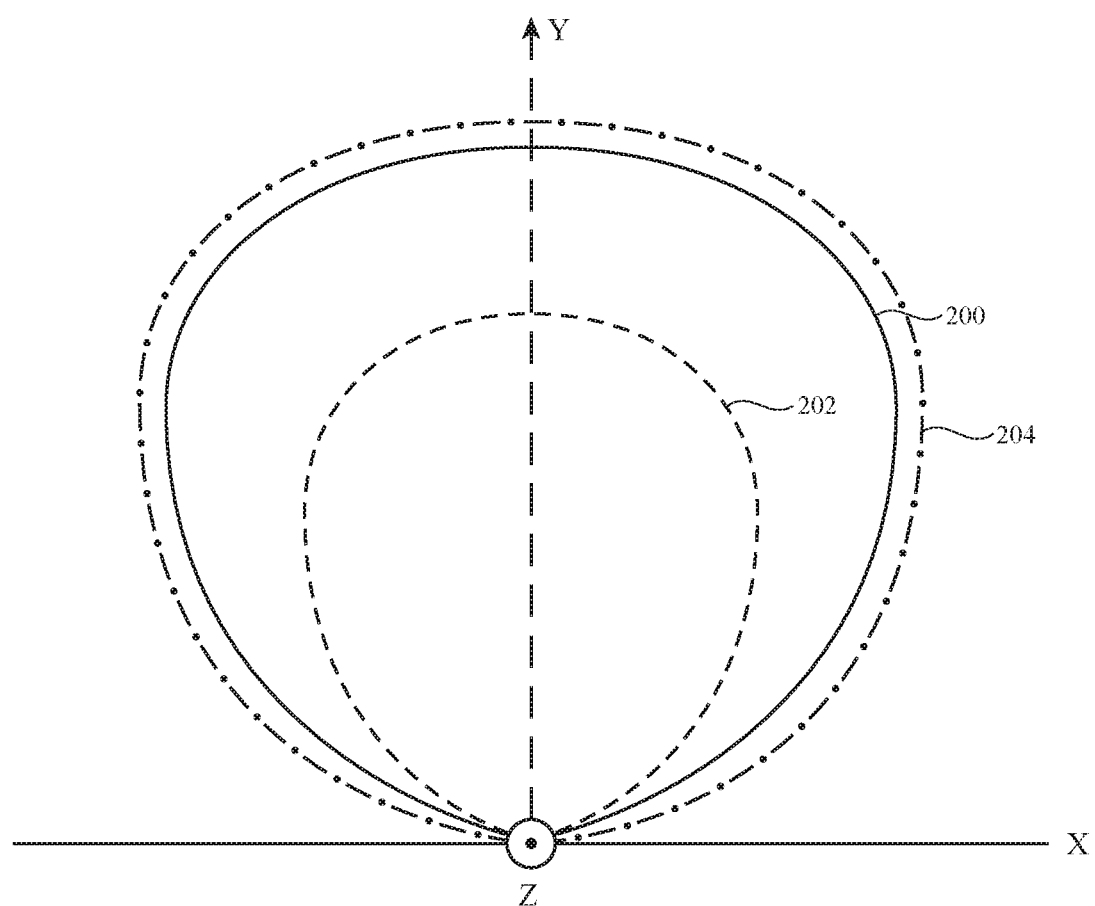
FIG. 13 is a diagram of illustrative antenna radiation patterns associated with antennas having different dielectric covers such as the dielectric covers of FIGS. 7-12 in accordance with an embodiment.

FIG. 13 shows a diagram of illustrative radiation patterns (e.g., radiation pattern envelopes) of antenna array 60 when provided with different types of dielectric covers. In the perspective of FIG. 13, antenna array 60 may lie in the x-z plane of FIG. 13. As shown in FIG. 13, curve 200 illustrates a radiation pattern envelope of antenna array 60 without any dielectric covers placed in the x-z plane and radiating in the y-direction. However, when a cover with planar inner and outer surfaces (e.g., cover 122 in FIG. 7) is placed over array 60, the radiation pattern envelope narrows from curve 200 to curve 202. In other words, the placement of cover 122 over 60 may reduce the antenna signal coverage area of array 60. This reduction may, for example, be caused by interference between the transmitted signals and signals that are reflected off of the interfaces of the cover.

Replacing cover 122 with a cover having a curved inner surface (e.g., cover 130 in FIG. 8, cover 140 in FIG. 9, cover 150 in FIG. 10, cover 160 in FIG. 11, cover 170 in FIG. 12) may cause array 60 to exhibit a radiation pattern envelope as shown by curve 204. As shown in FIG. 13, curve 204 covers a wider area than curve 200 where no cover is placed over array 60. Curve 204 covers a much wider area than curve 202 where a cover with a planar inner surface is placed over array 60. In particular, because a cover with a curved inner surface is provided over array 60, the curved cover acts as a lens to broaden the antenna beam coverage area of array 60, whereas having only a planar cover (e.g., cover 122 in FIG. 7) serves to narrow the antenna beam coverage area. The planar cover has interfacial surfaces that allow for substantial reflection of radio-frequency signals, which lowers antenna gain across almost all frequencies, whereas curved covers of the types shown in FIGS. 8-11 reduce the incident angles of the radio-frequency signals across the entire field of view of the array, thereby reducing signal reflection and resulting in increased antenna gain and a wider area of coverage. These curves are merely illustrative. For example, when a cover with a curved inner surface is placed over array 60, the signal coverage may be similar to the coverage in free space (e.g., without a dielectric cover). The radiation pattern of antenna arrays covered by dielectric covers may have any other desired shapes. The radiation pattern shown in FIG. 13 illustrates a two-dimensional view of radiation patterns. In general, radiation patterns generated by antenna arrays are three-dimensional. As an example, the radiation patterns shown by curves 200, 202, and 204 may be rotationally symmetrical about the y-axis in a three-dimensional representation of FIG. 13.

The foregoing is merely illustrative and various modifications can be made to the described embodiments. The foregoing embodiments may be implemented individually or in any combination.

What is claimed is:

1. An electronic device, comprising:
   a phased antenna array comprising first and second antenna elements;
   transceiver circuitry coupled to the phased antenna array and configured to convey wireless signals at a frequency greater than 10 GHz using the phased antenna array; and
   a dielectric cover that overlaps the phased antenna array and has first and second surfaces, the second surface being between the first surface and the phased antenna array, wherein the second surface defines first and second recesses, the first recess overlapping the first antenna element and the second recess overlapping the second antenna element.

2. The electronic device defined in claim 1, wherein the phased antenna array comprises additional antenna elements, the electronic device further comprising:
   a dielectric substrate, wherein the first, second, and additional antenna elements are formed on the dielectric substrate.

3. The electronic device defined in claim 2, further comprising:
   beam steering circuitry coupled to the first, second, and additional antenna elements and configured to convey the wireless signals through the dielectric cover.

4. The electronic device defined in claim 3, further comprising:
   an electronic device housing, wherein the dielectric cover forms a part of the electronic device housing.

5. The electronic device defined in claim 2, wherein a dielectric-filed gap separates the second surface of the dielectric cover from the first, second, and additional antenna elements on the dielectric substrate.

6. The electronic device defined in claim 1, wherein the first surface of the dielectric cover comprises a curved portion.

7. The electronic device defined in claim 6, wherein an additional curved portion in the second surface defining the first recess has a first radius of curvature and the curved portion in the first surface has a second radius of curvature, the second radius of curvature being greater than or equal to the first radius of curvature.

8. The electronic device defined in claim 1, wherein the first surface of the dielectric cover comprises a planar surface.

9. An electronic device, comprising;
   antennas in an antenna array and configured to convey radio-frequency signals at a frequency greater than 10 GHz; and
   a dielectric cover layer having a first surface facing the antenna array and an opposing second surface, wherein the dielectric cover layer defines a plurality of curved cavities at the first surface, each curved cavity overlapping a corresponding one of the antennas in the antenna array, and the antennas in the antenna array are configured to convey the radio-frequency signals through the plurality of curved cavities in the dielectric cover layer.

10. The electronic device defined in claim 9, wherein the antennas comprise a plurality of patch antenna elements formed over a ground plane.

11. The electronic device defined in claim 10, wherein each curved cavity in the plurality of the curved cavities is aligned with a corresponding one of the patch antenna elements in the plurality of patch antenna elements.

12. The electronic device defined in claim 9, wherein a portion of the second surface overlapping the plurality of curved cavities has a first radius of curvature and each portion of the first surface defining the plurality of curved cavities has a second radius of curvature that is less than the first radius of curvature.

13. An electronic device, comprising:
   an antenna configured to convey radio-frequency signals at a frequency greater than 10 GHz; and
   a dielectric radome having first and second opposing surfaces and a notch at the first surface overlapping the antenna, wherein the first surface of the dielectric radome faces the antenna, the second surface of the dielectric radome comprises a planar surface overlapping the notch, the antenna is configured to convey the radio-frequency signals through the first and second surfaces of the dielectric radome, and a first thickness of the dielectric radome at a region laterally surrounding the notch is greater than a second thickness of the dielectric radome at the notch.

14. The electronic device defined in claim 13, further comprising:
   an electronic device housing, wherein the dielectric radome is formed from a portion of the electronic device housing.

15. The electronic device defined in claim 13, further comprising:
   a dielectric substrate, wherein the antenna comprises an antenna element disposed on a curved surface of the dielectric substrate.

16. The electronic device defined in claim 13, further comprising:
   an additional antenna, wherein the dielectric radome has an additional notch at the first surface overlapping the additional antenna.

17. The electronic device defined in claim 16, wherein the planar surface overlapping the notch overlaps the additional notch.

18. The electronic device defined in claim 16, wherein the region of the dielectric radome having the first thickness is between the notch and the additional notch.

19. The electronic device defined in claim 13, wherein the first surface of the dielectric radome comprises an additional planar surface that laterally surrounds the notch and the planar surface at the second surface overlaps the additional planar surface at the first surface.

* * * * *